United States Patent [19]

Pattantyus

[11] Patent Number: 4,926,354
[45] Date of Patent: May 15, 1990

[54] POWER CONTROLLER WITH LOW STANDBY CURRENT DRAIN

[75] Inventor: Tamas Pattantyus, Birmingham, Mich.

[73] Assignee: Allied-Signal Inc., Morris Township, Morris County, N.J.

[21] Appl. No.: 412,727

[22] Filed: Sep. 26, 1989

[51] Int. Cl.$^5$ .................... H02M 3/335; H02M 7/537
[52] U.S. Cl. ........................ 363/98; 363/132; 363/60; 307/270; 307/584
[58] Field of Search ............ 363/17, 95, 97, 98, 363/132, 59, 60, 61; 307/246, 270, 577, 584; 323/289

[56] References Cited

U.S. PATENT DOCUMENTS

| | | | |
|---|---|---|---|
| 4,316,243 | 2/1982 | Archer | 363/132 |
| 4,358,728 | 11/1982 | Hashimoto | 323/907 |
| 4,733,159 | 3/1988 | Edwards et al. | 323/282 |
| 4,802,075 | 1/1989 | Bassols | 363/98 |
| 4,811,192 | 3/1989 | Egawa | 323/289 |
| 4,864,479 | 9/1989 | Steigerwald et al. | 363/98 |

Primary Examiner—Peter S. Wong
Attorney, Agent, or Firm—Markell Seitzman

[57] ABSTRACT

A power controller (30) comprising a plurality of MOSFET transistor switches (Q5, Q6, Q13, Q14) adapted to control the current flow through a load such as a DC motor (M), gated charge pump circuits (32a,b) are provided to control the conductivity of two (Q5, Q6) of the switches for applying driving voltages to the motor in response to direction defining control signals (/FWD, /REV) to control the direction of movement of the motor, the charge pump circuits are configured to provide for zero quiescent current flow.

12 Claims, 3 Drawing Sheets

POWER CONTROLLER WITH LOW STANDBY CURRENT DRAIN

BACKGROUND AND SUMMARY OF THE INVENTION

The present invention relates to a power amplifier or controller for a DC motor, and more particularly to a device characterized by a near zero off-duty current drain.

DC motor control has previously been accomplished by use of semiconductor devices. FIGS. 1a-c are illustrative of one type of semiconductor power controller consisting of four switches SW1-4 to control a motor or load generally shown as M. In the off-state switches SW3 and SW4 are closed, thereby applying a short circuit clamp across the motor M. As it is known in the art dynamic braking is achieved by short-circuiting the motor terminals A and B in an armature controlled permanent magnet DC motor. Forward motion of the load or motor is accomplished by closing switches SW1 and SW4. In this condition current will flow from terminal A to terminal B. Alternatively, closing switches SW2 and SW3 causes a reversal of current flow from terminal B to terminal A, thereby reversing the direction of the load or motor. By utilizing the teachings of the circuit in FIGS. 1, a basic semiconductor power controller can be constructed. As illustrated in FIG. 2a, the controller 20 utilizes Metal-Oxide Silicone Field Effect Transistors (MOSFET) While FIG. 2a illustrates an N-type MOFSET, P-type MOSFETS can be used. If this were the case, the voltage polarity in the current directions described will be reversed FIG. 2c is illustrative of a complementary symmetry circuit using P-type MOSFETS.

MOSFETS typically include three active terminals, a gate (G) terminal, a drain (D) terminal, and a source (S). These three active terminals are illustrated with reference to transistor Q5 which corresponds to switch SW1. As is known in the art the MOSFET transistor Q5 further includes an additional terminal (B) corresponding to the active bulk or substrate of the transistor. With reference to FIGS. 1 and 2a, switches SW1-4, have been realized by four MOSFET transistors Q5, Q6, Q13 and Q14. The load such as motor (M) extends between terminals A and B which are defined as the junction between the source and drain terminals of the various respective pairs of transistors Q5-Q13 and Q6-Q14, respectively.

As can be seen in FIG. 2a, the drain terminals of transistors Q5 and Q6 are connected to a positive voltage potential (+V) while the source terminals of transistors Q13 and Q14 are connected to a negative source of potential (−V). If the present invention is used in a mobile environment, voltage source may be implemented by an automotive battery with +V equal to B+ and and −V equal to ground. The gate terminal of transistor Q13 is connected to receive a logic signal /FWD at terminal 24 and the gate terminal of transistor Q14 connected to receive another logic signal /REV at terminal 26. Logic signals /FWD and /REV are binary changing from +V to −V. Proper scientific notation would represent a complementary logic signal by a bar over the basic signal. This notation is used in the figures, however, in the written specification logical complementary signals are typed as /FWD, /REV, etc. The logic signals /FWD and /REV are connected to charge pump circuits 22a and b respectively. These charge pump circuits 22a and b are also controlled by a charge pump drive signal received at terminal C. The output of these charge pump circuits are connected to the gate terminal of transistors Q5 and Q6 respectively. It should be appreciated that to turn MOSFET devices such as those shown in FIG. 2a to an ON state requires an applied voltage potential at the gate terminal which is more positive than the respective source terminal. This function is achieved by the charge pump circuit which in simple terms generates an output signal substantially greater than the value of the positive voltage potential (+V). FIG. 2b illustrates a rudimentary charge pump circuit 22a connected to positive and negative voltage potentials. The charge pump circuit 22a comprises capacitor C1, diodes D1 and D2 and a switch generally designated as SWT. The charge pump circuit such as circuit 22a is controlled by a gate signal which as shown below can be either of the /FWD and /REV signals or related signals. The capacitance CG (shown in dotted line) between the gate terminal and the negative voltage potential (−V) represents the effective capacitive input between the gate and source terminals of the MOSFET devices such as Q5 or Q6. The switch SWT is a single pole double-throw switch which alternatively switches one side of capacitor C1 between the positive and negative voltage potentials (+V and −V). With switch SWT closed and connected to the negative voltage potential (−V), the capacitor C1 will charge through diode D1 such that its terminal nearest the switch SWT is negatively charged. The other terminal near the junction of the two diodes will, of course, be charged positively. When the switch SWT is moved in contact with the positive voltage potential (+V) the effective gate-to-source capacitance CG would be charged through diodes D1 and D3 to the level of the positive voltage potential (+V) and by the voltage stored on capacitor C1 through diode D3 such that the voltage across capacitor CG will be approximately equal to: $V_{CG}=2*V*C1/(C1+CG)$. During the next pumping cycle the voltage will again increase across capacitor CG and this process is continued until the voltage across the effective capacitance CG is approximately equal to twice the positive voltage potential. The above relationship can be approximated by: $V_{CG}=2*V*[1-a^k]$ where $a=CG/(C1+CG)$ and k is the number of charge pumping cycles. Since a 1 as k increases $a^k \to$ and $V_{CG} \to 2V$. As is known in the art and appreciated as a practical matter, the gate-to-source capacitance of the devices Q5 or Q6 must be discharged as soon as the supply voltage to the load (M) is switched off, i.e., this will occur when transistors Q13 and Q14 are simultaneously switched on and occurs when /FWD=+V and /REV=+V. In addition, the other charge pumping such as 22b must not be activated on a non-driving side of the circuit shown in FIG. 2a, i.e., on the side of transistor Q6 in the case of a /FWD drive signal or on side Q5 in the case of a /REV drive signal. As an example, in the FWD (forward) mode, i.e., /FWD=−V transistors Q5 and Q14 are on, and charge pumping is achieved on the side of Q5. If the charge pumping was also achieved on the side of Q6, it would also be turned on. In that case the conducting transistors Q6 and Q14 would present a near short circuit between +V and −V lines. Briefly returning to FIG. 2a, the /FWD and /REV signals are shown which will cause the load or motor (M) to drive in a forward direction. The signals of course will be reversed to drive the motor in the opposite direction with /FWD=/REV=+V the motor is deactivated or stopped.

With reference to FIG. 2c, Transistors Q5 and Q6 are P-type MOFSETS which can be turned on by making their gates more negative than their sources. If control signal /FWD and /REV swing between −V and +V, then in the quiescent state both /FWD and /REV are at +V, causing transistors Q13 and Q14 to be fully turned on and Q5 and Q6 to be fully turned off. If /FWD is switched to −V while /REV is held at +V, transistors Q5 and Q14 are turned on, transistors Q6 and Q13 are turned off, thus causing the load current to flow from terminal A to B (positive, or forward drive). If, on the other hand, /REV is switched to −V while /FWD is held at +V, transistors Q6 and Q13 will be fully turned on and Q5 and Q14 will be fully turned off causing the current to flow from terminal B to A.

In spite of the fact that the complementary symmetry circuit of FIG. 2c is conceptually much simpler than FIG. 2a, it is subject to severe limitations. For instance, it is difficult to find P-type MOSFET devices which can conduct more than −20 amperes continuously. In addition, P-type MOSFET devices are much more expensive than the N-types.

If currents greater than 20 amperes must be handled or cost is an important factor, a configuration of the type shown in FIG. 2a is the only viable method.

An object of the present invention is to provide a semiconductor power controller for a motor whereby the standby current drain is essentially zero amperes. A further object of the present invention is to incorporate within such power amplifier a gated charge pump circuit. Accordingly, the present invention, in its simplest form comprises: a power controller for a load such as a DC motor comprising:

direction switch comprising a MOSFET transistor direction switch comprising a MOSFET transistor adapted to be connected between a positive voltage potential (+V) and one terminal of the load for causing the load to move, when activated, in a first direction. The power controller additionally includes first charge pump means associated with the first direction switch. The first charge pump means includes first means (Q1, D1, D3, C1) for generating a first voltage signal in a response to a first state of a first control signal, at the gate terminal of the first direction switch substantially larger, in an absolute sense, than the value of the positive voltage potential (+V), for driving such switch between conductive and nonconductive states and second means, operative when the first direction switch is in a nonconductive state, for discharging the gate-to-source capacitance, associated with the first direction switch. The controller in practice includes four MOSFET transistor switches arranged in an H-bridge the upper switches each having associated therewith a charge pump for controllably activating same in response to complementary sets of first and second control signals. Each charge pump includes means for discharging the gate-to source capacitance of these switches. The two charge pumps are driven by a common charge pump drive circuit which generates a substantially, square wave charge pump drive signal which oscillates between a given voltage range to charge corresponding capacitors to a level to place the upper switches in a conductive state.

Many other objects and purposes of the invention will be clear from the following detailed description of the drawings.

DETAILED DESCRIPTION OF THE PREFERRED EMBODIMENT

Figures 1A, 1B, 1C:
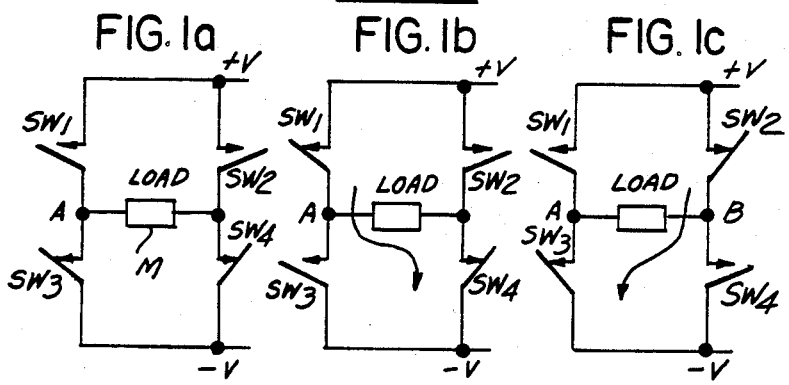
FIGS. 1a,b and c diagramatically illustrate a prior art power amplifier.
Figure 2A:
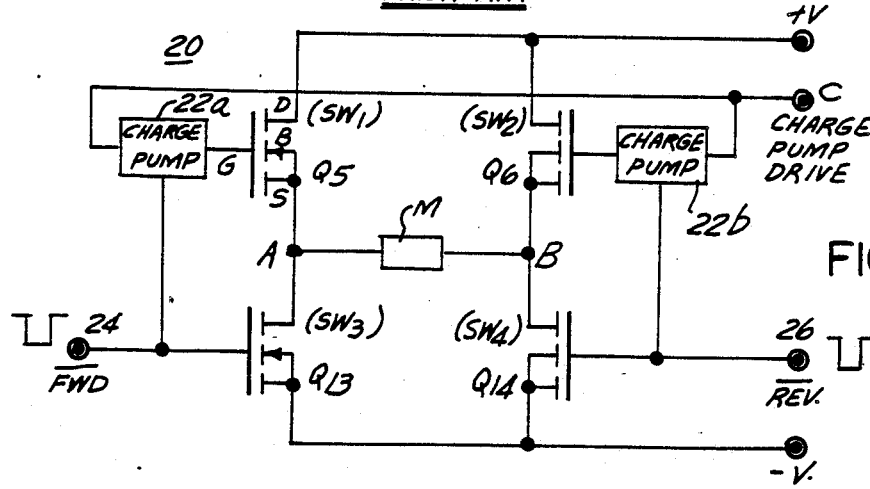
FIG. 2a illustrates the power amplifier of FIG. 1 in greater detail.
Figure 2C:
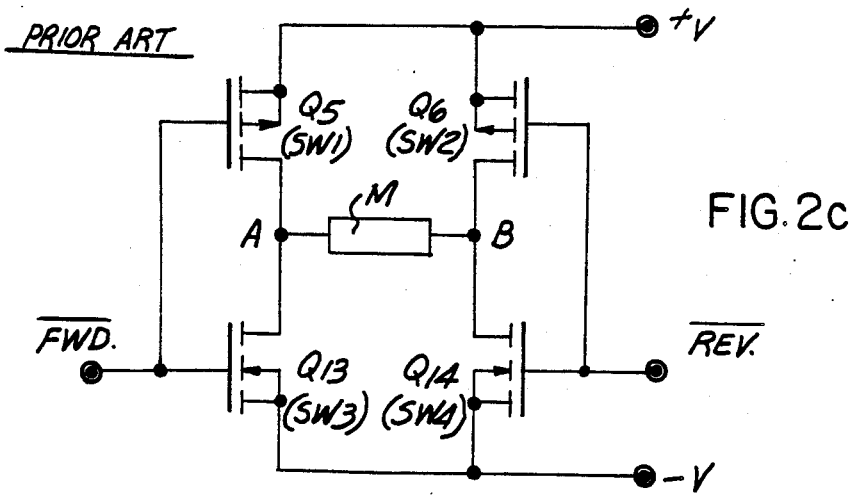
FIG. 2c illustrates another prior art power amplifier.
Figure 2B:
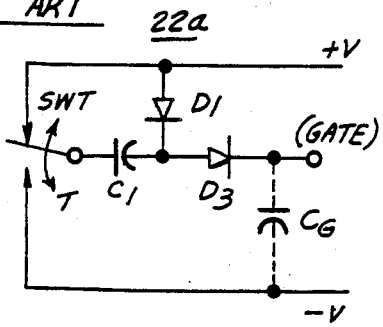
FIG. 2b illustrates a prior art charge pump circuit.
Figure 3B:
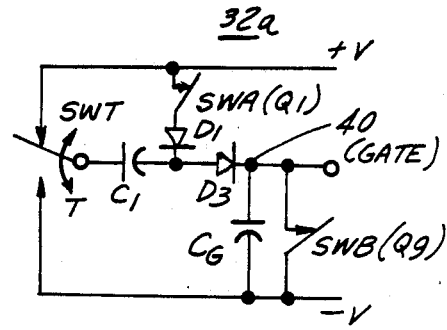
FIG. 3b illustrates an improved charge pump circuit.
Figure 3A:
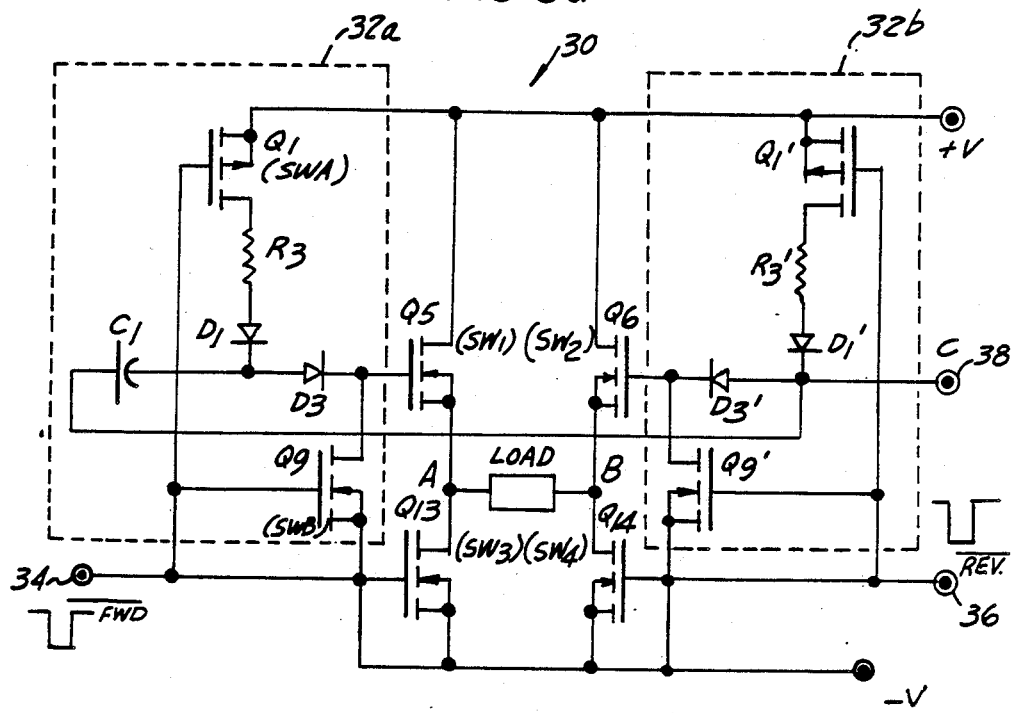
FIG. 3a illustrates a power amplifier constructed in accordance with the present invention.

Having described the prior art, FIG. 3a illustrates one embodiment of the present invention and illustrates a power controller or amplifier 30. As can be seen, the general structure of FIG. 3a is similar to FIG. 2a with the exception that the charge pump circuitry 32a and b (which is shown within the dotted line). The charge pump 32b is identical in form and function to that of 32a. Turning for the moment to FIG. 3b there is illustrated a schematic diagram of the present gated or switched charged pump circuit 32a. It can be seen that the structure of this charge pump circuit is similar to that shown in FIG. 2b. Added to the charge pump circuit of FIG. 2b are an additional switch SWA in series with diode D1 and a switch SWB connected in parallel across the gate-to-source capacitance CG (shown in dotted line) of a typical MOSFET device. While diodes are shown in the preferred embodiment transistor implementations, as known in the art, are within the scope of the present invention and considered as equivalent thereto. These switches SWA and SWB are also referred to as transistors Q1 and Q9 respectively. Further, and as will be described below, these additional switches SWA and SWB can be controlled by a single logic (gate) signal such as /FWD and/or /REV. When a particular set of direction control switches (Q5, Q14 or Q6, Q13, see FIG. 3a) is active, the respective switch SWA is closed and switch SWB is opened in an associated charge pump. Switch SWA completes the circuit between capacitor C1, diodes D1, D3 and gate-to-source capacitance CG as described above. When switch SWA is open, the charge path to capacitor C1 is broken, consequently no charge pumping takes place, i.e., zero quiescent current, between capacitors C1 and CG and the direction control switches SW1 (Q5) and SW2 (Q6) respectively in its branch of the controller 30, remain in an off-state. During this operating state (i.e., switch SWA-open) switch SWB is closed, therefore, any unwanted charge leakage into the gate-to-source capacitance CG is shunted to the negative potential (−V) line.

Returning to FIG. 3a and considering the case wherein it is desired to have the load or motor (M) move in a forward direction. In this case a negative (−V) logic signal /FWD is transmitted to terminal 34 and a positive (+V) logic signal /REV is transmitted to terminal 36. In this situation the signal /FWD will cause the transistor Q1 (of the charge pump circuit 32a) which is a P-type MOSFET device to be switched on, thereby causing the charge pump driver 32a to be operative. Transistor Q9, shown as an N-type MOSFET device, which corresponds to switch SWB, remains off. An additional gated voltage signal is impressed at terminal C (also called 38) and is derived from a charged pump driver circuit oscillator (as described below) to alternatively drive this terminal substantially between positive and negative potential (+V and −V). Additional charge is transferred to, i.e., pumped, into the gate-to-source capacitance CG of transistor Q5 since transistor Q1 (switch SWA) is closed. In addition, the signal /FWD causes the N-type MOSFET device Q13 to be turned off. By turning off transistor Q9 the charge pump circuit 32a is operative and achieves the condition such as that shown in FIG. 3b. By turning off transistor Q13 prevents current flow from terminal A of the load to the negative voltage potential and prevents a short circuit across Q5 and Q13. The increased positive voltage potential derived at the output of the charge pump circuit 32a, i.e., G node 40 places transistor Q5 (switch SW1) in its conductive state.

Simultaneous with the above-described operation on the right side of FIG. 3a, the positive /REV signal will disable a corresponding transistor Q9′ in charge pump 32b. Charge pumping will not occur in the right hand portion of FIG. 3a since at this time its corresponding switch SWA, i.e., transistor Q1′ is disabled. Further, since terminal 36 is at a high voltage state in response to /REV, transistor Q14 (switch SW4) is driven to its fully on condition. The /REV signal will place transistor Q6 (switch SW2) in its off state as it will be clamped to the negative voltage (−V) potential by virtue of the short circuit created across transistor Q9′ which is turned on. With transistor Q5 in its fully on condition terminal A of the load (M) will be clamped to the positive voltage potential (+V) line. With transistor Q14 in its full or closed state, terminal B of the load will be clamped to the negative potential (−V) line. As such it can be seen by virtue of the above described logic inputs and the operation of the gated charged pump circuits, current will flow through the load from terminal A to terminal B causing it to move in a first (positive) or forward direction. The operation of the above circuit is symetric between the two sides of the above-described power amplifier 30 and a similar action will take place when the polarities /FWD and /REV signals are reversed with current flowing in the opposite direction (i.e., B-to-A). When /FWD and /REV both are high, the controller 30 is in a quiescent state.

The resistor R3 in series with diode D1 provides for a minute delay in the on-time switching of transistor Q5 such as to avoid a short circuit across transistors Q5 and Q13 (switches SW1 and SW3).

Figure 4:
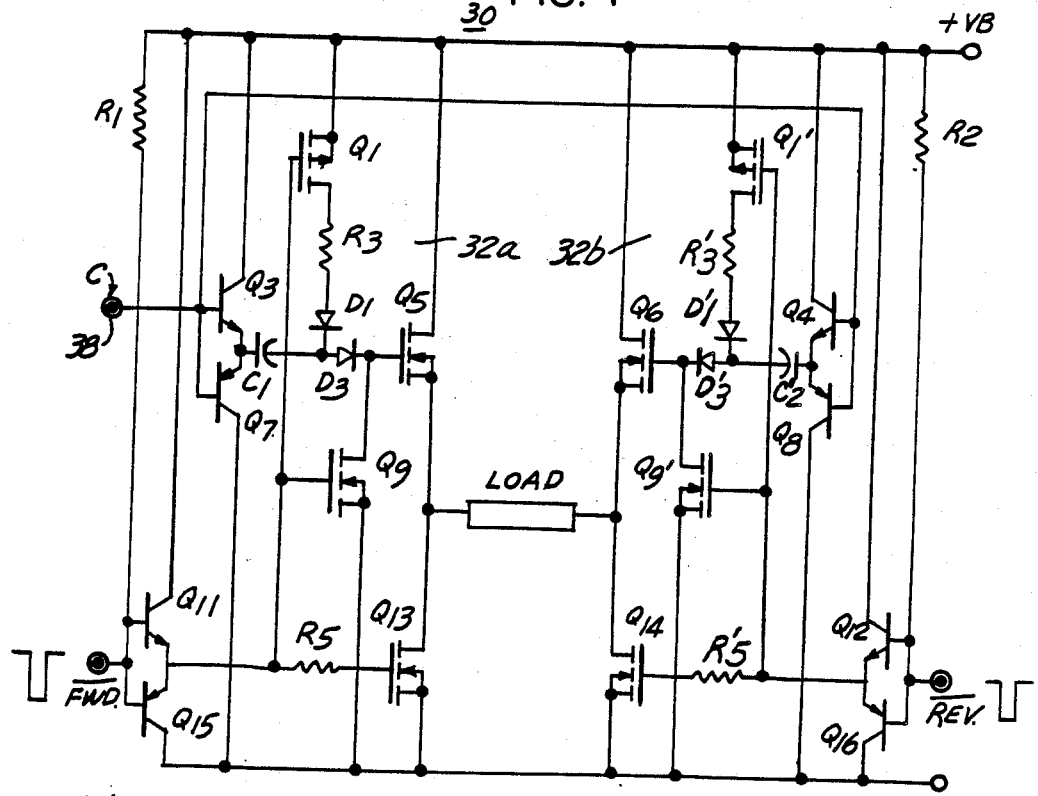
FIG. 4 illustrates a more complete circuit diagram of the present invention.

FIG. 4 illustrates an expanded version of a power amplifier 30 fabricated in accordance with the present invention. Transistor pairs (complementary emitter followers) Q3, Q7 and Q4 and Q8, which are each used in a complementary mode have been added to provide some degree of power amplification between the charge pump drive circuitry (which generates a signal CHP at node C or 38) and the charge pump circuits 32a and b. In addition, transistor pairs Q11, Q15 and Q12 and Q16, have been added to enhance the current drive capabilities between the control circuits (not shown) which generate the logic signals /FWD and /REV and the gate terminals of the power transistors Q13 and Q14. This additional feature is desired since the gate capacitance of high current MOSFET devices such as transistors Q13 and Q14 are several nano-farads and for very high current power amplifiers two or more transistors connected in parallel (represented by transistors Q13 and Q14) make the initial gate current relatively large.

The operation of the circuit shown in FIG. 4 is substantially the same as that of FIG. 3a even with the addition of the various sets of complementary emitter following circuits The operation of complementary pairs Q11, Q15 and Q12, Q16 is similar, therefore only transistor pair Q11, Q15 will be described in detail. When the commom base drive of Q11, Q15 that is /FWD is changing from +V to −V, transistor Q11 will be turned off and Q15 turned on. Thus the charge stored in the gate capacitance of Q13 will be discharged through resistor R5 and transistor Q15; transistor Q15 will also discharge the gate capacitance of Q9. As a consequence Q9 and Q13 will be turned off. Transistor Q15 will negatively charge the gate capacitance of Q1, thus it will turn on. When signal /FWD changes from −V to +V, transistor Q11 will charge the gate capacitances of Q9 and Q13 positively, thus turning these transistors on, and it will discharge the gate of Q1, which, in turn, will be turned off. It should be appreciated that when the motor is off both /FWD and /REV are in the high voltage (off) conditions. These signals will then turn off transistors Q1 and Q1′ respectively (switches SWA). In this off state, transistors Q9 and Q9′ will not conduct any steady state current once the gate capacitances of transistors Q5 and Q6 (switches SW1 and SW2) are discharged.

Figure 5:
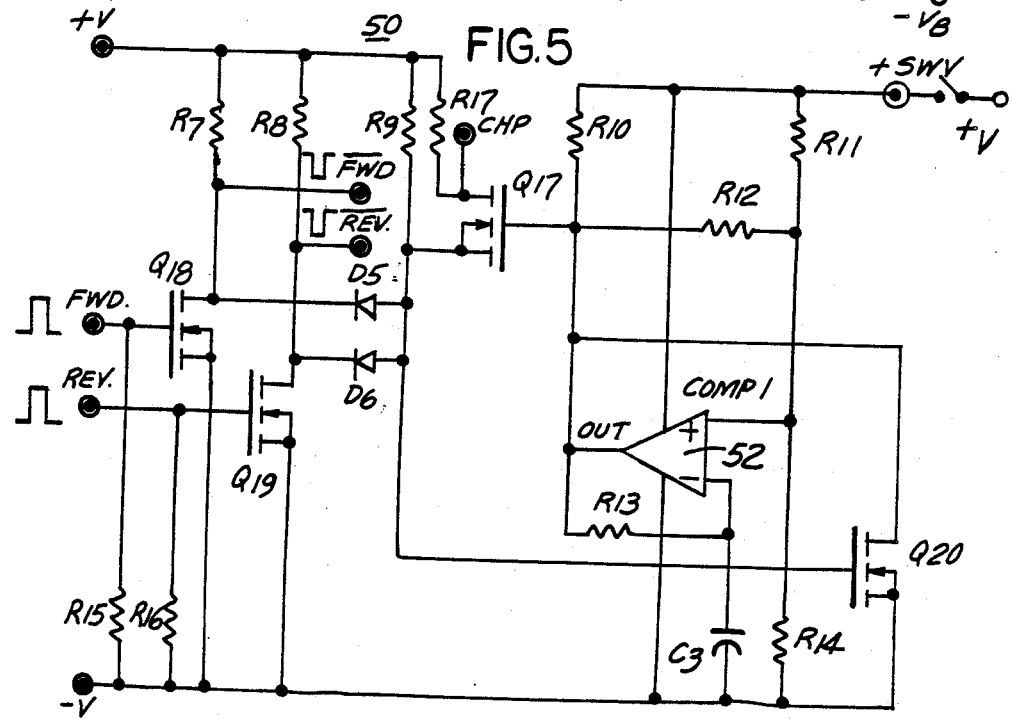
FIG. 5 illustrates ancillary circuits useable within the present invention.

FIG. 5 illustrates an exemplary charge pump drive circuit or oscillator generally shown as 50. The MOSFET transistors Q18 and Q19 represent interface devices between the power amplifier 30 and microprocessor ports of an ECU (not shown) which generate or sequences signals FWD and REV in the manner complementary to that described above for /FWD and /REV. When either the FWD or REV signal is high, the power amplifier 30 is activated upon generating negative going complementary /FWD and /REV signals. With a positive input signal (FWD) applied to the gate of transistor Q18 (or a +REV applied to transistor Q19) such transistor will become conductive generating a negative going /FWD (/REV) signal. Alternatively, if a negative going signal is communicated to the gate terminal of transistor Q18 (or Q19) the voltage signal developed for /FWD (or alternatively /REV) changes to a high voltage state. The output of each transistor Q18 and Q19 (/FWD or REV) is communicated to an OR gate comprising diodes D5 and D6. The presence of either signal /FWD or REV (active) will cause the respective cathode terminal of diode D5 or D6 to reside at or near the negative voltage potential (−V). As such, transistor Q17 will become activated and transistor Q20 will be turned off.

The following describes the generation of the charge pump activation signal (CHP) which is connected to terminal C of FIG. 3a.

When transistor Q20 is turned off the output signal (OUT) of comparator 52 is no longer clamped to the negative voltage potential (−V). If the voltage line SWV is near the value of the positive voltage potential (+V), or the positive battery potential, comparator 52 will be active. The comparator 52 and associated circuitry comprise a hysterisis oscillator. At the moment transistor Q20 is turned off and signal SWV is turned on, capacitor C3 will have been discharged by transistor Q20 through resistor R13 so that the negative input node of comparator 52 resides at the negative voltage potential (−V). Since the SWV signal is more positive than the negative voltage potential (−V), the positive node of comparator 52 is at a voltage defined as:

$$v(+) = SWV \frac{R14}{R14 + R11(R10 + R12)/(R10 + R11 + R12)} \quad (1)$$

As can be seen the output of comparator 52 is also approximately at the potential of the +SWV signal. If resistor R13 is very much greater than resistor R10 and if R11, R12, R14 are equal (R) and also significantly greater than resistor R10, the above equation 1 can be approximated by the following equation 2:

$$v(+) = SWV \frac{R}{R + R/2} = SWV*(2/3) \quad (2)$$

The output of comparator 52 will remain in a high voltage state until capacitor C3 charges up to approximately ⅔ of SWV. As is known the charging of capacitor C3 will be exponential with a time constant of TC=R13*C3 (approximate value).

As long as the output of comparator 52 is at the voltage level of approximately SWV, transistor Q17 is turned on thereby clamping the CHP signal at or near the negative voltage potential (−V) through resistor R17. When the voltage across capacitor C3 reaches (SWV)*(⅔) the output signal, OUT, of the comparator 52, begins to move toward the voltage rail −V, causing the positive node voltage, v(+) of the comparator to move below SWV*(⅔) which, in turn locks the comparator in the opposite state, i.e., when OUT is equal to −V and v(+) is approximately SWV*(⅓). In this state capacitor C3 is being discharged through resistor R13 and the voltage change across capacitor C3 (or v(−)) is an exponential function of similar properties when v(+) changes positively. The comparator remains in this state as long as v(−) is more positive than v(+). In summary, resistor R12 provides a positive feedback path, R13 and C3 permits a delay between the output, OUT, and the negative node and the combination of those conditions leads to continuous oscillation of circuit 50. When the comparator output, OUT, is at SWV, transistor Q17 is conducting, i.e., its drain (CHP) is clamped to −V and when OUT is at −V, transistor Q17 is turned off, causing its drain (CHP) to be at +V. The primary condition, however, of any voltage change at CHP is that either Q18 or Q19 at least momentarily be in the conductive state.

The voltage signal SWV is derived by special switching means from the positive voltage potential +V line. There are some conditions under which the power controller is not desired to be operational. In those cases the switch (mechanical or electronic) is opened between +V and SWV. By this convenient means the power controller can be activated or deactivated without interrupting that part of +V line which has to carry high levels of current.

In summary, the advantages of the present invention include:

(a) that all active, high power components in the circuit (Q5, Q6, Q13, Q14) are arranged such that they do not provide a DC short circuit path between positive and negative voltage potential, (b) that the standby current drain is essentially zero and at most equal to the leakage current of the semiconductor components, (c) that the amplifier circuit utilizes a gated charge pump concept which reduces the stress on the charge pump components of the unselected or passive side, (d) that the power amplifier provides a short circuit path across the load in the inactive state, insuring for the dynamic breaking of a permanent magnet armature controlled DC motor, and (e) that in the off-state the components of the amplifier are biased properly and are in a safe, well defined state.

Many changes and modifications in the above described embodiment of the invention can, of course, be carried out without departing from the scope thereof. Accordingly, that scope is intended to be limited only by the scope of the appended claims.

I claim:

1. A power controller (30) for a load such as a DC motor comprising:
   direction control means (Q5) including a first direction switch (Q5) comprising a MOSFET transistor adapted to be connected between a positive voltage potential (+V) and one terminal of the load (M) for causing the load to move, when activated, in a first direction;
   first charge pump means (32a) associated with the first direction switch (Q5), including first means (Q1, D1, D3, C1) for generating a first voltage signal in a response to a first state of a first control signal, at the gate terminal of the first direction switch (Q5) substantially larger, in an absolute sense, than the value of the positive voltage potential (+V), for driving such switch between nonconductive and conductive states; and second means (Q9), operative when the first direction switch (Q5) is in a nonconductive state, for discharging the gate-to-source capacitance (CG), associated with the first direction switch.

2. The device as defined in claim 1 wherein the first means comprises:
   a first charge switch (Q1, SWA), the input of which is adapted to receive the first control signal (/FWD), connected between a first diode (D1), and the positive voltage potential, the first diode (D1) connected to a common terminal of a series connected first capacitor (C1) and second diode (D3), the second diode connected to the gate of the first direction switch (Q5); including generating means (50), responsive to the state of the first control signal and communicated to another terminal of the first capacitor for generating a charge pump drive signal (CHP) which controllably oscillates substantially between the positive voltage potential and negative or ground potential.

3. The device as defined in claim 2 wherein the second means comprises a second charge switch (Q9), responsive to the first control signal (/FWD) and connected between the gate terminal of the first direction switch (Q5) and the negative or ground potential.

4. The device as defined in claim 3 wherein the direction control means comprises a second direction switch (Q13), connected between the one terminal of the load (M) and negative or ground potential, switchable between nonconductive and conductive states in response to the first and a second state of the first control signal.

5. The device as defined in claim 4 wherein the direction control means further includes
   a third direction switch (Q6) adapted to be connected to a second terminal of the load (M) for causing same to move, when activated, in an opposite, second direction;
   second charge pump means (32b) associated with the third direction switch (Q6) including third means (Q1', D1', D3', C1') for generating a second voltage signal (/REV), at the gate terminal of the third direction switch (Q6) substantially larger, in an absolute sense, than the value of the positive voltage potential (+V) for driving such third direction switch (Q6) between nonconductive and conductive states and fourth means (Q9'), operative when the third direction switch is in a nonconductive state, for discharging the gate-to-source capacitance (CG) associated with the third direction switch (Q6).

6. The device as defined in claim 5 wherein the third means comprises a third charge switch (Q1'), the input of which is adapted to receive the second control signal (/REV), connected between a third diode (D1') and the positive voltage potential, the third diode (D1') connected to a common terminal of a series connected second capacitor (C1') and fourth diode (D2'), the fourth diode (D2') connected to the gate of the third direction switch (Q6) and wherein the generating means is also responsive to the state of the second control signal (/REV) and wherein the charge pump drive signal (CHP) is also communicated to the other terminal of the second capacitor (C1').

7. The device as defined in claim 6 wherein the fourth means comprises a fourth charge switch (Q9'), responsive to the second control signal (/REV) and connected between the gate terminal of the third direction switch (Q6) and negative or ground potential and the direction control means comprises a fourth direction switch (Q14), connected between the second terminal of the load (M) and the negative or ground potential, switchable between conductive and nonconductive states in response to the first and a second state of the second control signal (/REV).

8. The device as defined in claim 7 including control means for generating first and second control signals (/FWD, /REV) in a manner to cause the load to move in the first direction, the second direction and to cause the load to stop, including
   first direction means for generating a negative going first state of the first control signal and a positive going first state of the second control signal wherein a response to the first state of the first control signal (/FWD) the generating means is activated to generate the charge pump drive signal (CHP), the first charge switch (Q1) is placed in its conductive state to enable the voltage on the first capacitor (C1) to rise thereby placing the first direction switch (Q5) in a conductive state, and the second charge switch (Q9) and second direction switch (Q13) are each placed in a nonconductive state; and wherein in response to the first state of the second control signal (/REV), the third charge switch (Q1') is placed in a nonconductive state thereby disabling the voltage build up on the second capacitor (C1'), the fourth charge switch (Q9') placed in a conductive state to discharge the gate-to-source capacitance of the third direction switch (Q6) and the fourth direction switch (Q14) placed in a conductive state to provide a current flow path across the load through the first and fourth direction switches (Q5, Q14) respectively, and
   the control means including second direction means for generating a positive going second state of the first control signal and negative going second state of the second control signal wherein in response to the second state of the first control signal (/FWD) the first charge switch (Q1) is placed in a nonconductive state thereby disabling the voltage build up on the first capacitor (C1), the second charge switch (Q9) is placed in a conductive state to discharge the gate-to-source capacitance of the first direction switch (Q5) and the second direction switch (Q13) is placed in a conductive state, and wherein in response to the first state of the second control signal (/REV) the third charge switch (Q6) is placed in a conductive state to enable the voltage of the second capacitor (C1') to rise thereby placing the third direction switch (Q6) in a conductive state to provide a reverse current flow path through the load through the second and third direction switches (Q13, Q6) respectively, and further placing the fourth charge switch (Q9') and fourth direction switch (Q14) in nonconductive states;
   the control means including stop means for simultaneously generating both the second and the first states of the first and second control signals to deactivate the respective first charge switch (Q1) and third charge switch (Q1') thereby causing the first and third direction switches (Q5, Q6) to remain nonconductive disabling directional movement of the load (M).

9. The device as defined in claim 8 wherein the respective states of the first and second control signals are generated relatively simultaneously and wherein if the first and second control signals have the same states the motor is not driven, if the first control signal is in the first state while the second control signal is in the second state the motor is driven forward, while reversal of control signals and states corresponding to forward drive will cause the motor to be driven in reverse.

10. The device as defined in claim 9 wherein the first means and second means both include time delay means for respectively preventing first direction switch (Q5) and third direction switch (Q6) from becoming conductive prior to the instant when the second direction switch (Q13) and fourth direction switch (Q14) become nonconductive thereby preventing a short circuit across corresponding terminals of the load.

11. The device as defined in claim 10 wherein the delay means includes a first resistor (R1) in circuit with first charge switch (Q1) and first diode (D1) and second resistor (R1') in circuit with the third charge switch (Q1') and third diode (D1').

12. The device as defined in claim 11 including a charge pump drive circuit for generating the charge pump signal (CHP) comprising:
   inversion means (Q18, Q19) responsive to input signals for generating the first (/FWD) and second (/REV) control signals;
   an OR-gate (D5, D6) connected to the inversion means (Q18, Q19) and the negative (−V) or ground potential;

a first gate switch (Q17) configured to be turned off in response to a negative going first or second control signal havings its drain terminal communicate to the positive voltage potential (+V), the drain terminal defining the charge pump signal (CHP), wherein when such switch is in an on state the CHP signal is at or near the positive voltage potential and when in an off state the CHP signal is at or near negative (−V) or ground potential, its source terminal connected to a gated input of a hysteresis oscillator and its gate terminal connected to the output (OUT) terminal of the hysteresis oscillator, the gated input of the hysteresis oscillator comprising a second gate switch (Q20) connected between the output (OUT) and the negative (−V) or ground potential, wherein when the first gated switch (Q17) is activated the second gated switch is turned off so as to no longer clamp the output (OUT) terminal to negative (−V) or ground potential; the hysteresis oscillator further including a comparator (52) having a negative input terminal, a positive input terminal and the output (OUT) terminal, the negative input terminal connected to the negative (−V) potential through a third capacitor (C3) and to the output (OUT) terminal through a first control resistor (R13), the positive input terminal connected to the output terminal through a second control resistor (R12) and between the negative potential and a switched voltage source (SWV) through a resistance bridge (R11, R14), the switched voltage source (SWV) being at or near the value of the positive voltage potential (+V) and switched to an on state as the second gated switch is turned off, wherein when the second gated switch (Q20) is turned to an on state the third capacitor (C3) discharges thereby urging the voltage at the negative input terminal toward the negative potential, causing the output (OUT) terminal to reside at a determinable positive voltage turning on the first gated switch (Q17), clamping its drain terminal (CHP signal) to the negative potential, thereafter the output terminal of the comparator (52) will change state as the third capacitor (C3) charges, turning off the first gated switch (Q17) causing its drain terminal (CHP) to reside at or near the value of the positive voltage potential.

* * * * *